(12) United States Patent
Pagaila et al.

(10) Patent No.: US 8,525,344 B2
(45) Date of Patent: Sep. 3, 2013

(54) SEMICONDUCTOR DEVICE AND METHOD OF FORMING BOND WIRES BETWEEN SEMICONDUCTOR DIE CONTACT PADS AND CONDUCTIVE TOV IN PERIPHERAL AREA AROUND SEMICONDUCTOR DIE

(75) Inventors: Reza A. Pagaila, Singapore (SG); Byung Tai Do, Singapore (SG); Dioscoro A. Merilo, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 203 days.

(21) Appl. No.: 13/034,075

(22) Filed: Feb. 24, 2011

(65) Prior Publication Data

US 2012/0217643 A1 Aug. 30, 2012

(51) Int. Cl.
*H01L 29/40* (2006.01)
(52) U.S. Cl.
USPC .......................................... 257/774; 257/784
(58) Field of Classification Search
USPC .................. 438/106–127; 257/774–776, 784
See application file for complete search history.

(56) References Cited

U.S. PATENT DOCUMENTS

| | | | |
|---|---|---|---|
| 6,483,030 B1 * | 11/2002 | Glenn et al. .................. | 174/521 |
| 7,307,348 B2 * | 12/2007 | Wood et al. .................... | 257/774 |
| 7,327,032 B2 | 2/2008 | Yoon | |
| 7,528,009 B2 * | 5/2009 | Chen et al. ..................... | 438/106 |
| 2003/0034559 A1 * | 2/2003 | Liao .............................. | 257/738 |
| 2007/0023886 A1 * | 2/2007 | Hedler et al. ................. | 257/686 |
| 2007/0023888 A1 | 2/2007 | Fujii | |
| 2007/0085189 A1 | 4/2007 | Sunohara et al. | |

* cited by examiner

*Primary Examiner* — Richard Booth
(74) *Attorney, Agent, or Firm* — Robert D. Atkins; Atkins & Associates, P.C.

(57) ABSTRACT

A semiconductor wafer has a plurality of semiconductor die with contact pads. An organic material is deposited in a peripheral region around the semiconductor die. A portion of the organic material is removed to form a plurality of vias. A conductive material is deposited in the vias to form conductive TOV. The conductive TOV can be recessed with respect to a surface of the semiconductor die. Bond wires are formed between the contact pads and conductive TOV. The bond wires can be bridged in multiple sections across the semiconductor die between the conductive TOV and contact pads. An insulating layer is formed over the bond wires and semiconductor die. The semiconductor wafer is singulated through the conductive TOV or organic material between the conductive TOV to separate the semiconductor die. A plurality of semiconductor die can be stacked and electrically connected through the bond wires and conductive TOV.

17 Claims, 14 Drawing Sheets

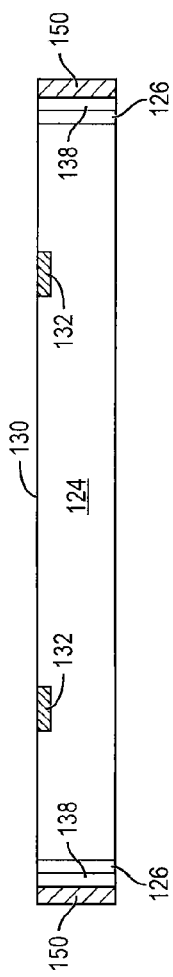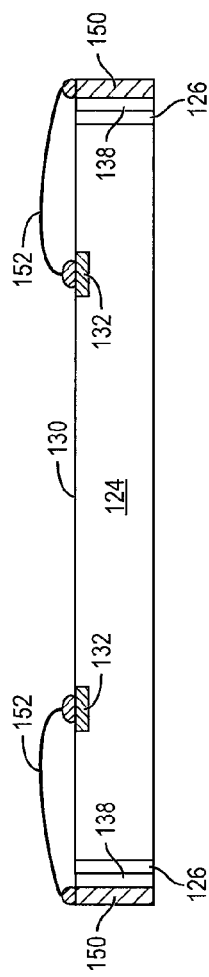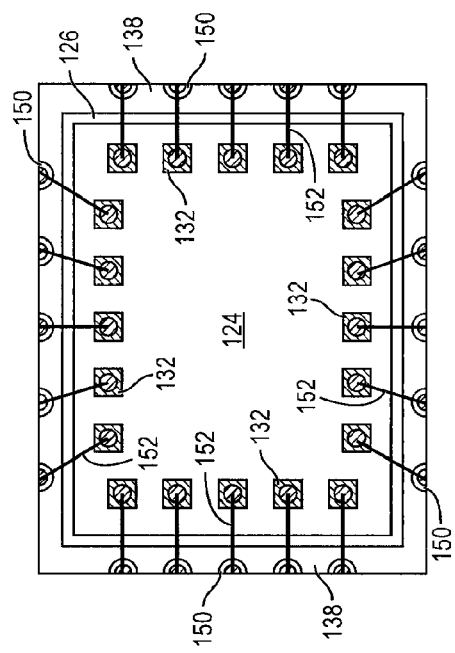
FIG. 4a
FIG. 4b
FIG. 4c

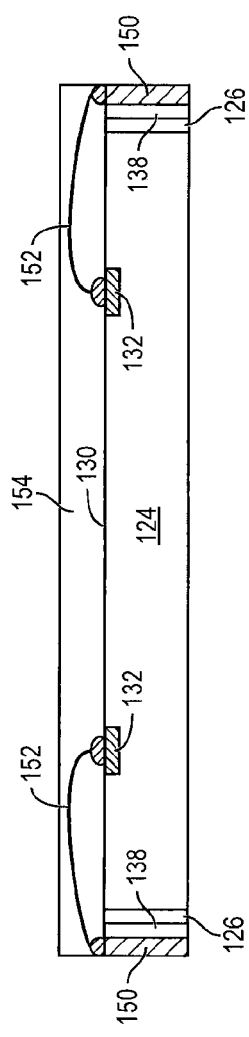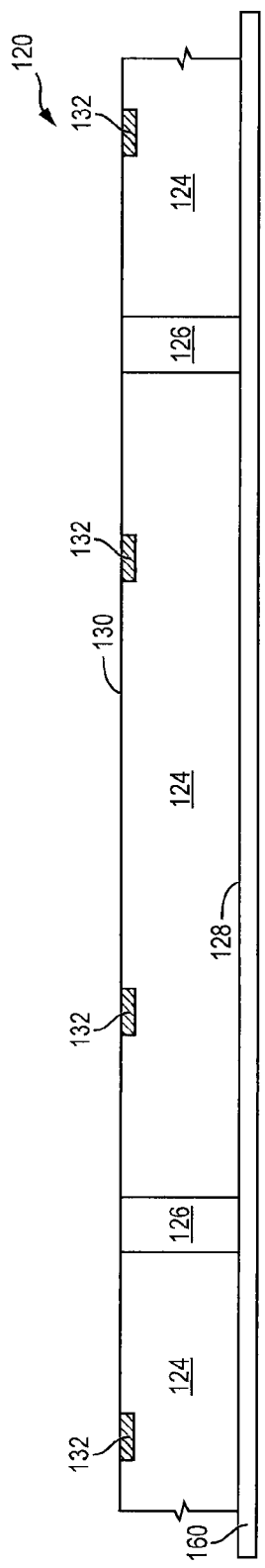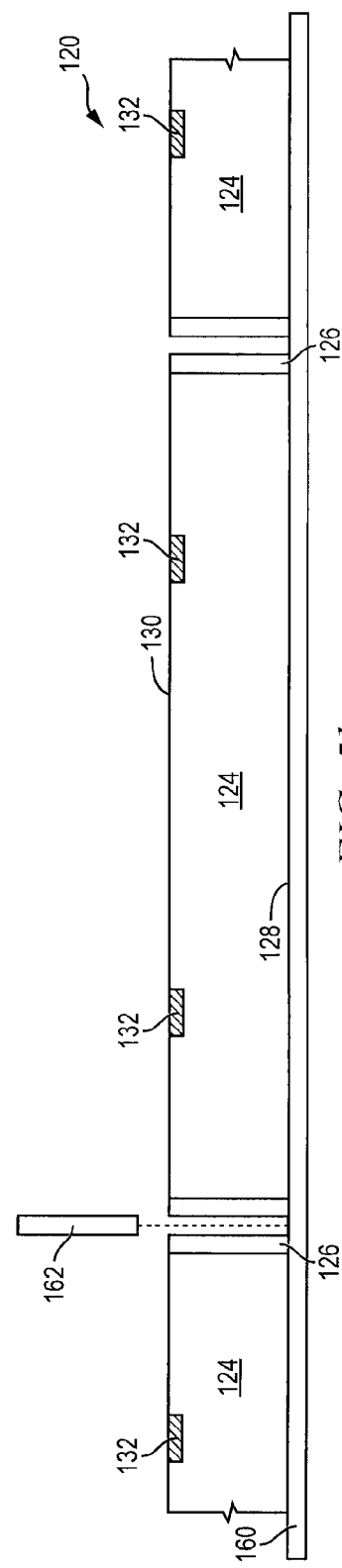
FIG. 4d
FIG. 5a
FIG. 5b

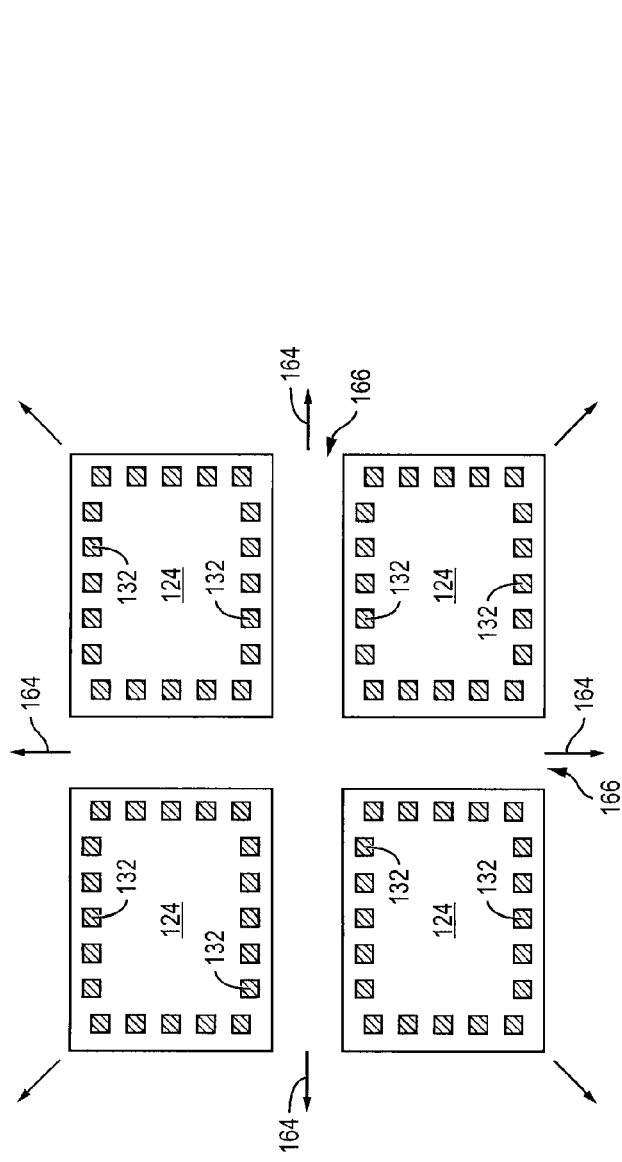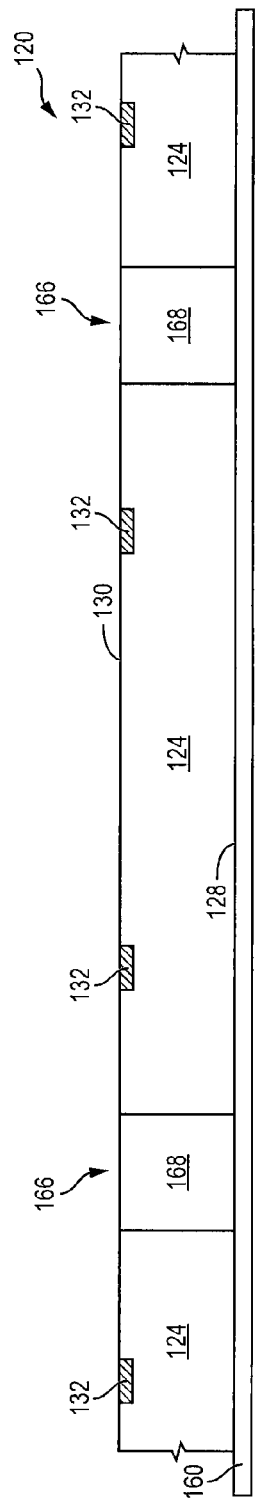

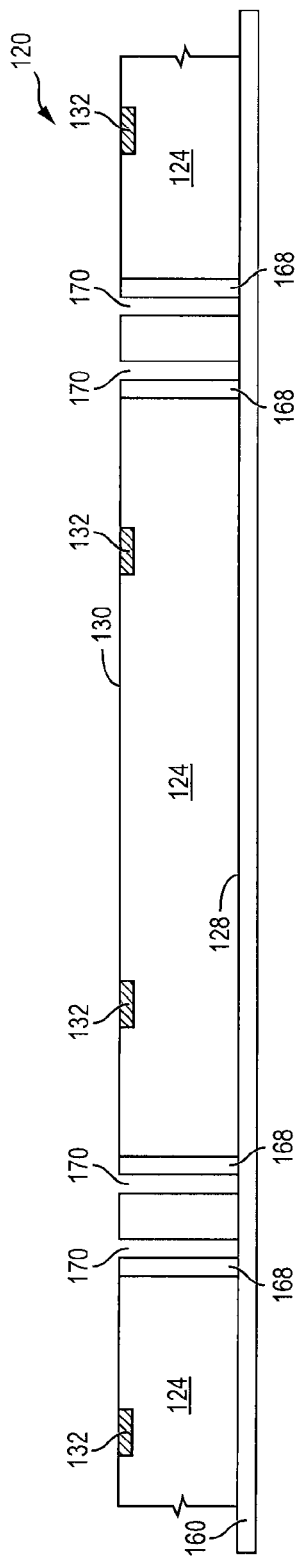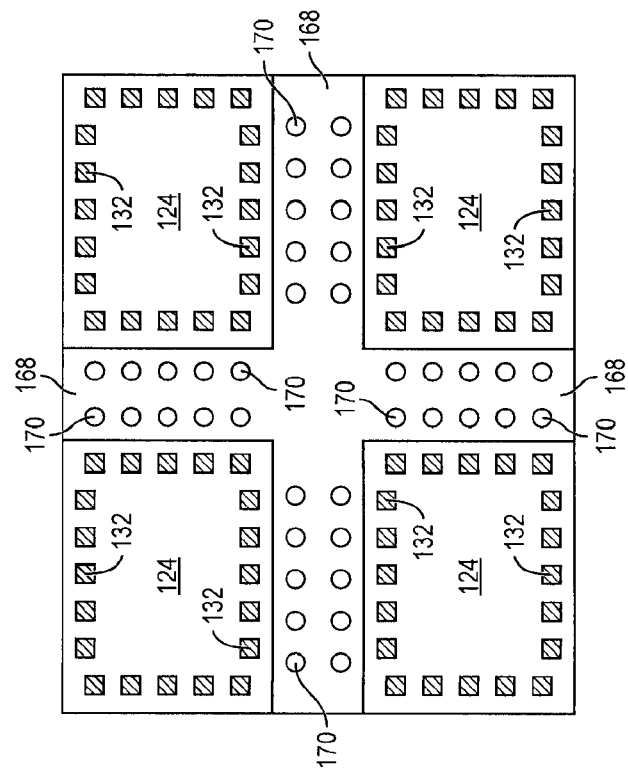
FIG. 5e
FIG. 5f

SEMICONDUCTOR DEVICE AND METHOD OF FORMING BOND WIRES BETWEEN SEMICONDUCTOR DIE CONTACT PADS AND CONDUCTIVE TOV IN PERIPHERAL AREA AROUND SEMICONDUCTOR DIE

FIELD OF THE INVENTION

The present invention relates in general to semiconductor devices and, more particularly, to a semiconductor device and method of forming bond wires between semiconductor die contact pads and conductive TOVs formed through organic material in a peripheral area around the semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. The term "semiconductor die" as used herein refers to both the singular and plural form of the word, and accordingly can refer to both a single semiconductor device and multiple semiconductor devices. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size can be achieved by improvements in the front-end process resulting in die with smaller, higher density active and passive components. Back-end processes may result in semiconductor device packages with a smaller footprint by improvements in electrical interconnection and packaging materials.

Semiconductor die are commonly stacked or otherwise require vertical z-direction interconnect capability. The vertical interconnect can be achieved with conductive through hole vias (THV) or conductive through silicon vias (TSV). The conductive vias are electrically connected to contact pads on the semiconductor die with redistribution layers (RDL). The RDL is formed with a metal deposition process, which is costly during manufacturing and prone to defects if the metal leaches to unintended conductive structures and circuits.

SUMMARY OF THE INVENTION

A need exists to electrically interconnect semiconductor die in a cost-effective and efficient manner. Accordingly, in one embodiment, the present invention is a method of making a semiconductor device comprising the steps of providing a semiconductor wafer having a plurality of semiconductor die with contact pads, depositing organic material in a peripheral region around the semiconductor die, removing a portion of the organic material to form a plurality of vias, depositing a conductive material in the vias to form conductive TOV, forming bond wires between the contact pads and conductive TOV, forming an insulating layer over the bond wires and semiconductor die, and singulating the semiconductor wafer through the peripheral region to separate the semiconductor die.

In another embodiment, the present invention is a method of making a semiconductor device comprising the steps of providing a semiconductor wafer having a plurality of semiconductor die, depositing an insulating material in a peripheral region around the semiconductor die, forming a plurality of first conductive vias in the insulating material, forming bond wires between contact pads on the semiconductor die and the first conductive vias, forming an insulating layer over the bond wires and semiconductor die, and singulating the semiconductor wafer through the peripheral region to separate the semiconductor die.

In another embodiment, the present invention is a method of making a semiconductor device comprising the steps of forming a plurality of first conductive vias through insulating material in a peripheral region of a semiconductor die, forming bond wires between contact pads on the semiconductor die and the first conductive vias, and forming an insulating layer over the bond wires and semiconductor die.

In another embodiment, the present invention is a semiconductor device comprising a semiconductor die with insulating material formed around a peripheral region of the semiconductor die. A first conductive via is formed through the insulating material in the peripheral region of the semiconductor die. A bond wire is formed between a contact pad on the semiconductor die and the first conductive via. An insulating layer is formed over the bond wire and semiconductor die.

BRIEF DESCRIPTION OF THE DRAWINGS

FIGS. 4a-4d illustrate the semiconductor die with bond wires formed between contact pads and half conductive TOVs;

FIGS. 5a-5j illustrate a process of forming bond wires between semiconductor die contact pads and full conductive TOVs formed through organic material in a peripheral area around the semiconductor die;

DETAILED DESCRIPTION OF THE DRAWINGS

Figure 1:
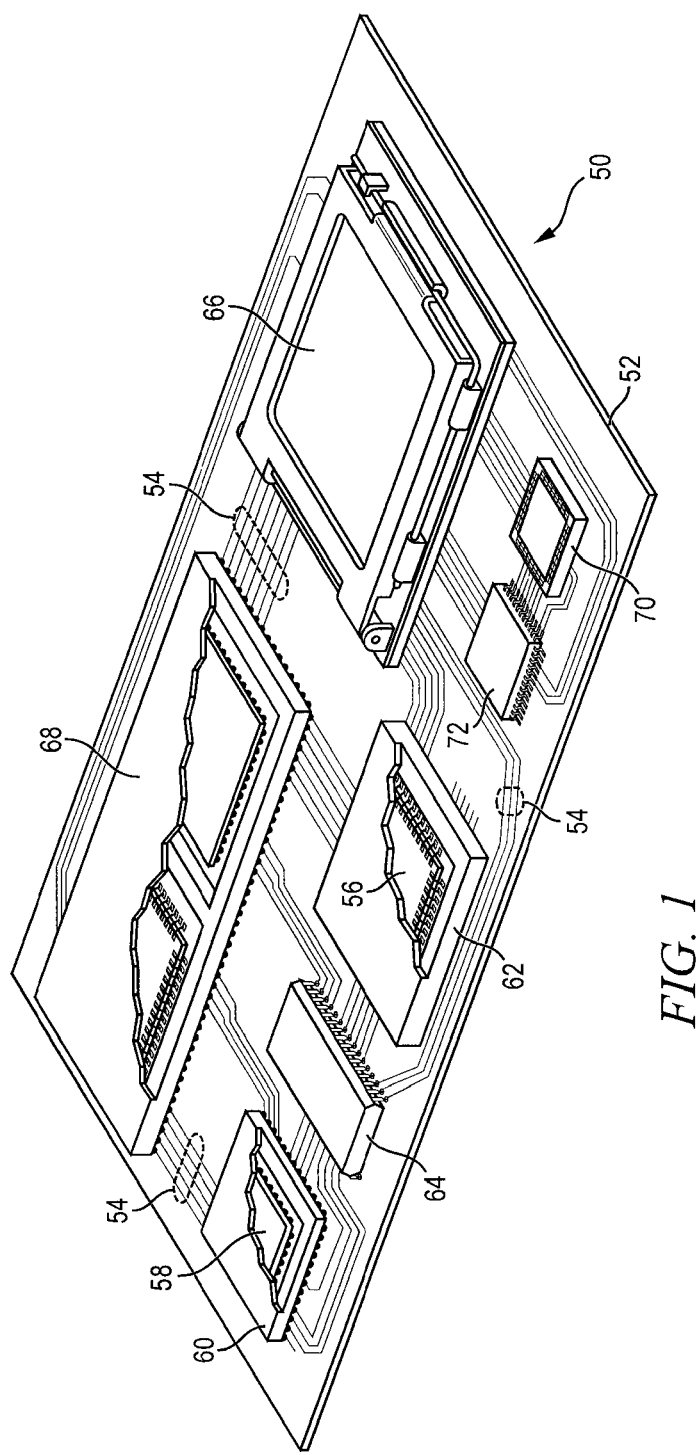
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
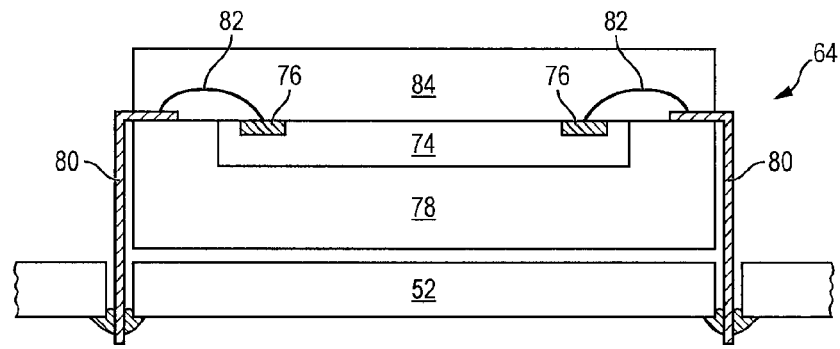
FIGS. 2a-2c illustrate further detail of the representative semiconductor packages mounted to the PCB.
Figure 2B:
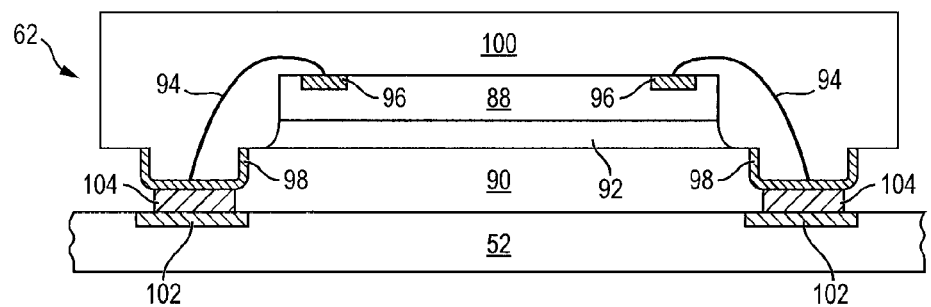
Figure 2C:
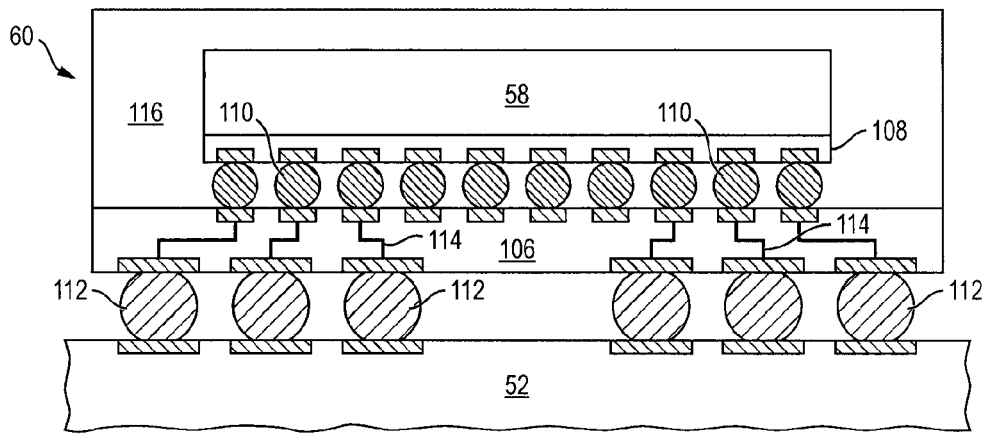

FIGS. 2*a*-2*c* show exemplary semiconductor packages. FIG. 2*a* illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating die 74 or bond wires 82.

FIG. 2*b* illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2*c*, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
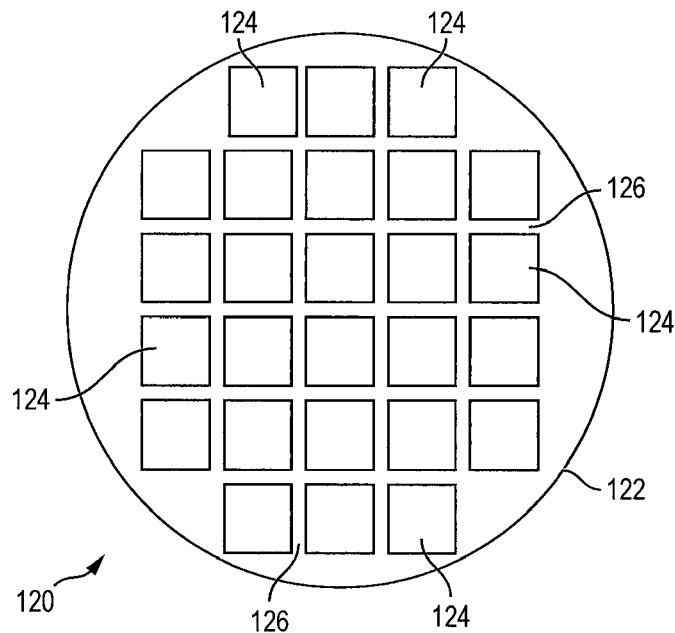
FIGS. 3a-3j illustrate a process of forming bond wires between semiconductor die contact pads and half conductive TOVs formed through organic material in a peripheral area around the semiconductor die.

FIGS. 3*a*-3*j* illustrate, in relation to FIGS. 1 and 2*a*-2*c*, a process of forming bond wires between semiconductor die contact pads and half conductive TOVs formed through organic material in a peripheral area around the semiconductor die. FIG. 3*a* shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by inter-die wafer area or saw streets 126 as described above. Saw streets 126 provide cutting areas to singulate semiconductor wafer 120 into individual semiconductor die 124. In one embodiment, semiconductor die 124 may have dimensions ranging from 2×2 millimeters (mm) to 15×15 mm.

Figure 3B:
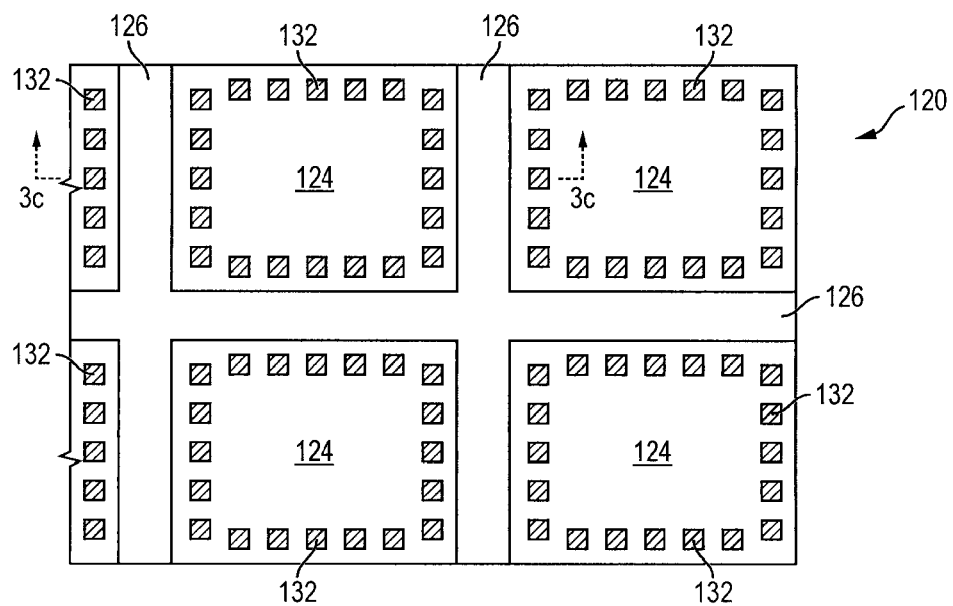
Figure 3C:
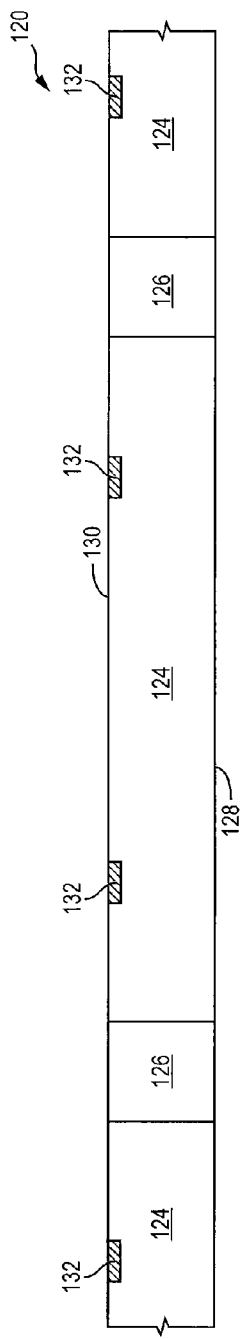

FIG. 3b shows a top view of a portion of semiconductor wafer 120. FIG. 3c shows a cross-sectional view of a portion of semiconductor wafer 120, taken along line 3c-3c in FIG. 3b. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPD), such as inductors, capacitors, and resistors, for RF signal processing. In one embodiment, semiconductor die 124 is a flipchip type semiconductor die.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3D:
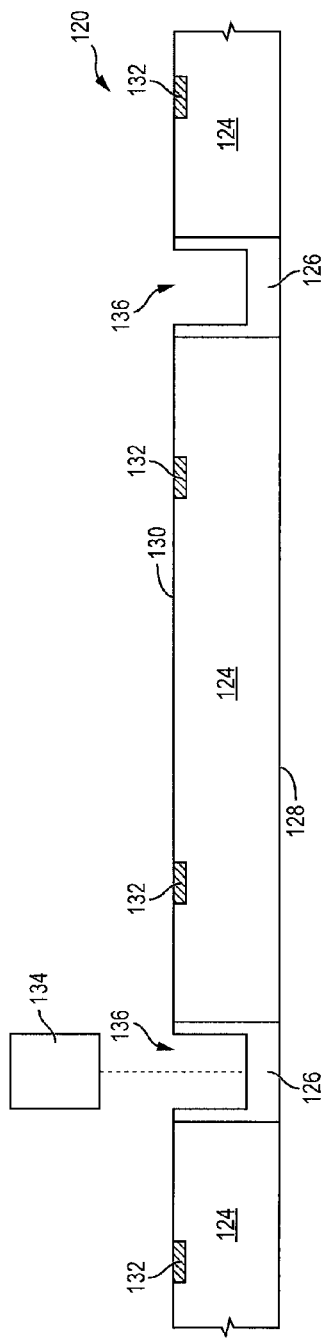

In FIG. 3d, a saw blade or laser cutting tool 134 forms channels or trenches 136 by partially cutting through saw streets 126. In one embodiment, the width of trench 136 is less than a width of saw street 126. Alternatively, trench 136 consumes the entire saw street 126. Cutting tool 134 does not completely penetrate through thickness of semiconductor wafer 120. For example, cutting tool 134 may cut through 60% of the wafer thickness, depending on the depth of via. The cutting operation does not require dicing tape or other wafer support material or step to keep semiconductor die 124 in place because the cutting does not completely sever semiconductor wafer 120. The uncut portion of the wafer material in saw street 126, directly under trench 136, maintains the structural support and integrity of semiconductor wafer 120 for subsequent manufacturing operations.

Figure 3E:
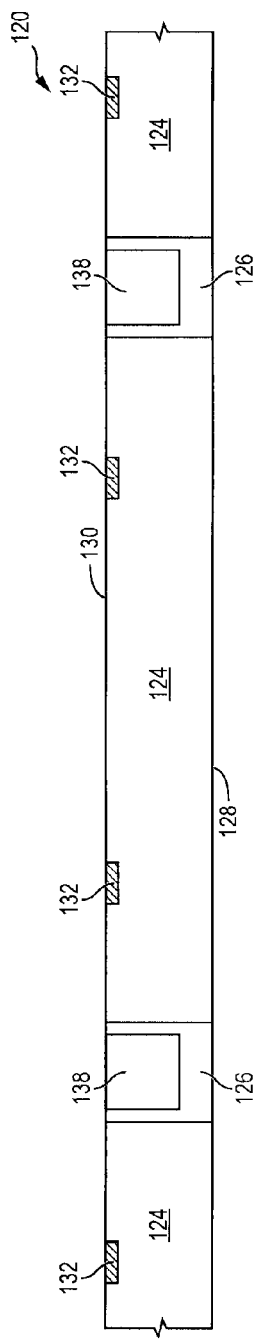

In FIG. 3e, organic material 138 is deposited in trench 136 by spin-coating or needle dispensing, or other suitable application process. Organic material 138 can be benzocyclobutene (BCB), polyimide (PI), or acrylic resin. Alternatively, other non-conductive materials such as a polymer molding compound, liquid epoxy molding, compression molding, soft laminating film, or other material having dielectric or electrical insulating properties can be deposited in peripheral region 136. The non-conductive materials can also be deposited using a transfer molding or injection molding process. Organic material 138 fills trench 136 up to the top surface of active surface 130 of semiconductor die 124.

Figure 3F:
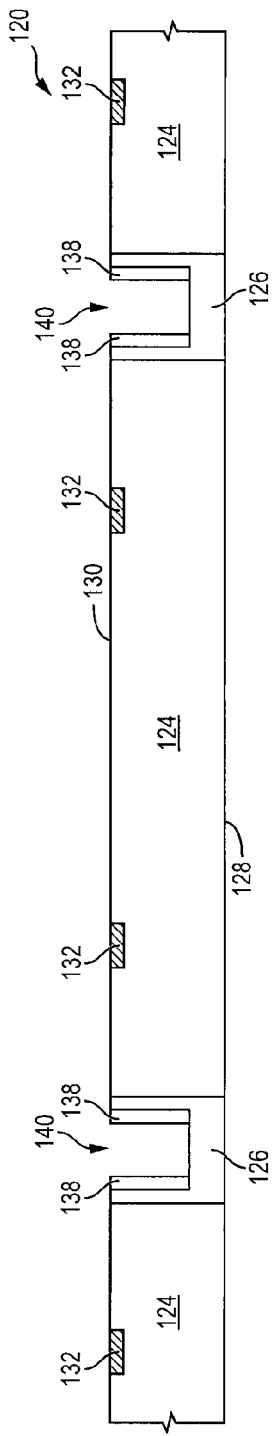
Figure 3G:
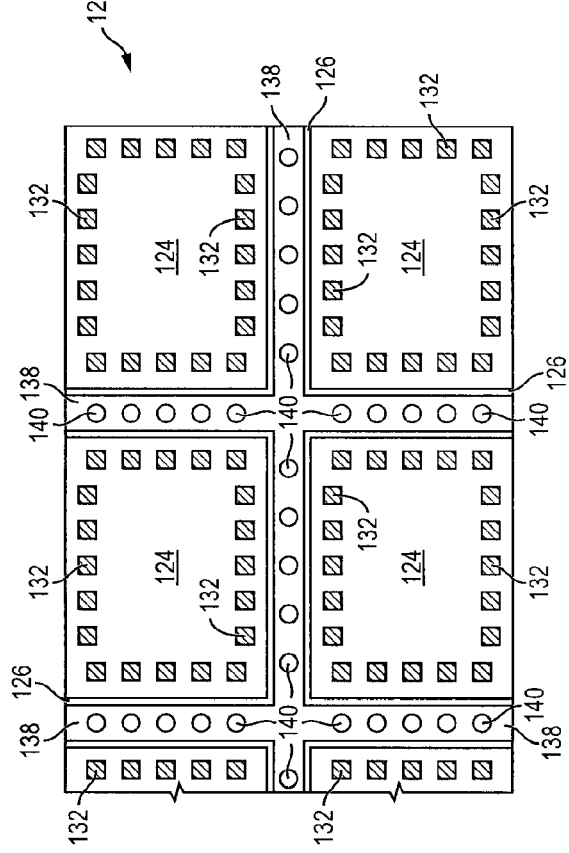

In FIG. 3f, a plurality of vias 140 is cut into organic material 138 along saw streets 126 using a mechanical drill, laser drill, or etching process. Vias 140 are placed along semiconductor die 124 in locations corresponding to contact pads 132. The laser drilling operation is centered about the channel of saw street 126 and makes a hole having a diameter less than the width of organic material 138. In one embodiment, the diameter of via 140 is about 10 micrometers (μm) to 100 μm, depending on the required via depth. Contact pads 132 and vias 140 have a separation of about 20 μm to 150 μm, depending on the diameter and depth of the via. FIG. 3g shows a top view of vias 140 formed in organic material 138.

Figure 3H:
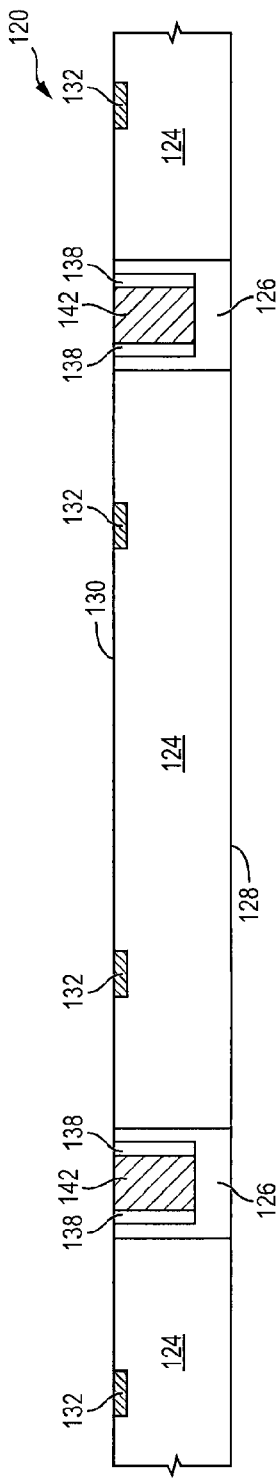

In FIG. 3h, an electrically conductive material is deposited into vias 140 through a deposition process such as plating or plugging to form conductive through organic vias (TOV) 142. The conductive material can be Al, Cu, Sn, Ni, Au, Ag, tungsten (W), or other suitable electrically conductive material. Conductive TOVs 142 are formed in and surrounded by organic material 138.

Figure 3I:
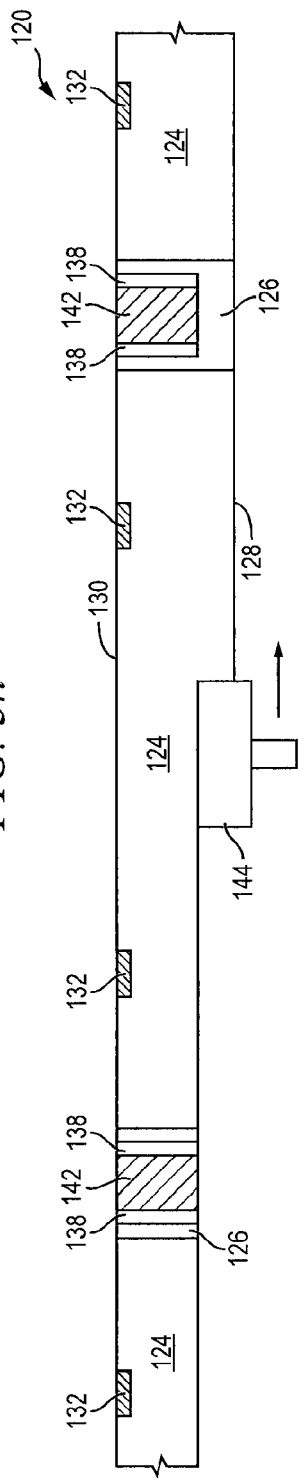

In FIG. 3i, backside 128 of semiconductor wafer 120 is subjected to a backgrinding process by grind wheel 144 to remove bulk semiconductor material and expose conductive TOVs 142. The uncut portion of the wafer material in saw streets 126 maintains the structural support and integrity of semiconductor wafer 120 for the previous manufacturing operations. Conductive TOVs 142 have been formed without the need for dicing tape or other wafer support material or step to keep the die in place during via formation.

Figure 3J:
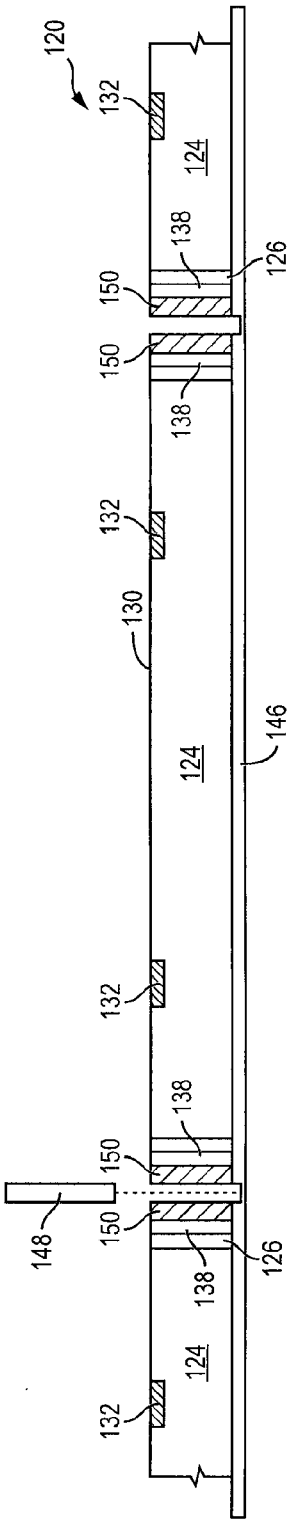

In FIG. 3j, semiconductor wafer 120 is mounted to dicing tape 146 for structural support of the wafer during the final singulation to separate semiconductor die 124. A saw blade or laser cutting tool 148 cuts through a center of conductive TOVs 142 down to dicing tape 146 to completely sever the conductive TOVs into two half conductive TOVs 150. A pick and place operation removes semiconductor die 124 as individual units from dicing tape 146.

FIG. 4a shows a cross-sectional view of semiconductor die 124 with contact pads 132 and half conductive TOVs 150. In FIG. 4b, bond wires 152 are formed between contact pads 132 and half conductive TOVs 150. Bond wires 152 are electrically connected to contact pads 132 and half conductive TOVs 150 with bond wire bumps or other bond wire interconnect structure. In one embodiment, bond wires 152 have a maximum height of 25 μm above active surface 130. Conductive TOVs 150 provide vertical z-direction electrical interconnect between opposite sides of semiconductor die 124. Bond wires 152 offer a low-cost and effective approach to electrical interconnect for semiconductor die 124. FIG. 4c shows a top view of semiconductor die 124 with contact pads 132 and half conductive TOVs 150 interconnected by bond wires 152.

In FIG. 4d, an insulating or passivation layer 154 is formed over active surface 130 and bond wires 152 using PVD, CVD, printing, spin coating, spray coating, sintering or thermal oxidation. The insulating layer 154 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. In one embodiment, insulating layer 154 is 50-100 μm in thickness to completely cover and protect bond wires 152. The bond wires 152 and insulating layer 154 can be formed prior to wafer singulation.

Alternatively, an encapsulant or molding compound is deposited over semiconductor die 124 and bond wires 152 using a paste printing, compressive molding, transfer molding, liquid encapsulant molding, vacuum lamination, spin coating, or other suitable applicator. The encapsulant can be polymer composite material, such as epoxy resin with filler, epoxy acrylate with filler, or polymer with proper filler. The encapsulant is non-conductive and environmentally protects the semiconductor device from external elements and contaminants.

Figure 5G:
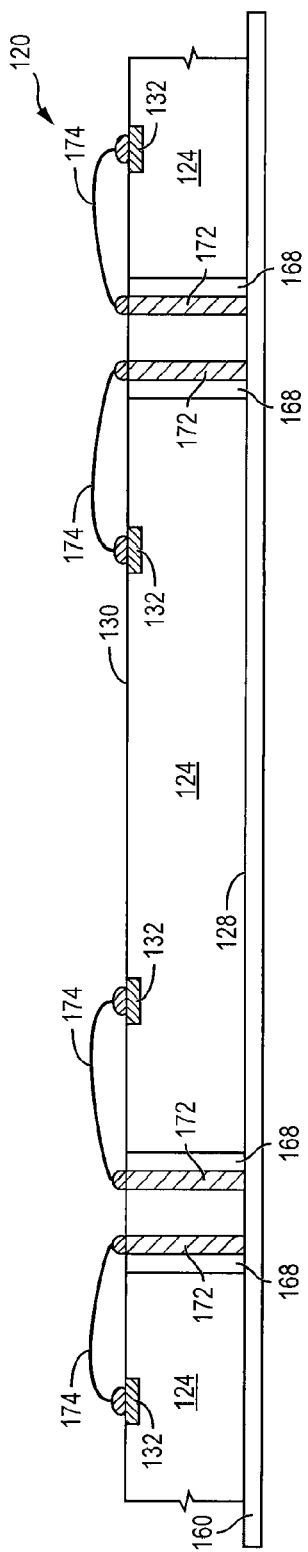

FIGS. 5a-5j illustrate, in relation to FIGS. 1 and 2a-2c, a process of forming bond wires between semiconductor die contact pads and full conductive TOVs formed through organic material in a peripheral area around the semiconductor die. Continuing from FIG. 3b, back surface 128 of semiconductor wafer 120 is mounted to expansion table 160, as shown in FIG. 5a. In FIG. 5b, a saw blade or laser cutting tool 162 cuts through saw street 126 down to expansion table 160 in a dicing operation. In one embodiment, saw blade 162 cuts a gap having a width less than the width of saw street 126. Alternatively, saw blade 162 has the same width as saw street 126. In FIG. 5c, expansion table 160 moves in two-dimension lateral directions, as shown by arrows 164, to create a greater physical separation between semiconductor die 124 and form a peripheral region 166. Expansion table 160 moves substantially the same distance in the x-axis and y-axis within the tolerance of the table control to provide separation around a periphery of each die. The post-expansion width of peripheral region 166 ranges from 5-200 μm. The expanded dimension depends on the design embodiment, i.e., half-TOVs, full-TOVs, single row via, or double/multiple row via.

In an alternative embodiment, the semiconductor wafer is diced to separate the semiconductor die. The individual semiconductor die are then transferred and affixed to a temporary chip carrier in a pick-and-place operation using an adhesive layer, e.g., thermal epoxy. The semiconductor die are placed on the chip carrier so as to have a predetermined separation or peripheral region. In general, the separation has sufficient width to form conductive TOVs within the peripheral region, as described below.

In FIG. 5d, an organic insulating material 168 is deposited in peripheral region 166 using spin coating, needle dispensing, or other suitable application process. Organic material 168 can be BCB, PI, or acrylic resin. Alternatively, other non-conductive materials such as a polymer molding compound, liquid epoxy molding, compression molding, soft laminating film, or other material having dielectric or electrical insulating properties can be deposited in peripheral region 166. The non-conductive materials can also be deposited using a transfer molding or injection molding process.

In FIG. 5e, a portion of organic material 168 is removed by mechanical drilling, laser drilling, or deep reactive ion etching (DRIE) to form side-by-side vias 170 that extend down to expansion table 160. Vias 170 extend completely through peripheral region 166, i.e., from one side of semiconductor die 124 to its opposite side. The sidewalls of vias 170 can be vertical or tapered. FIG. 5f shows a top view of side-by-side vias 170.

Figure 5H:
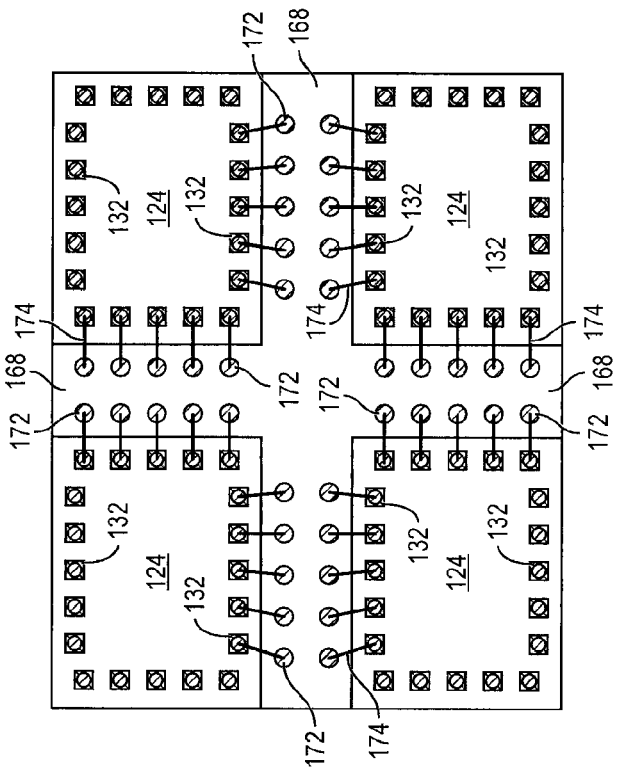

In FIG. 5g, an electrically conductive material is deposited into vias 170 through a deposition process such as plating or plugging to form side-by-side full conductive TOVs 172. The conductive material can be Al, Cu, Sn, Ni, Au, Ag, W, or other suitable electrically conductive material. Conductive TOVs 172 are formed in and surrounded by organic material 168. Bond wires 174 are formed between contact pads 132 and full conductive TOVs 172. Bond wires 174 are electrically connected to contact pads 132 and full conductive TOVs 172 with bond wire bumps or other bond wire interconnect structure. In one embodiment, bond wires 174 have a maximum height of 25 μm above active surface 130. Bond wires 174 offer a low-cost and effective approach to electrical interconnect for semiconductor die 124. FIG. 5h shows a top view of semiconductor die 124 with contact pads 132 and side-by-side full conductive TOVs 172 interconnected by bond wires 174.

Figure 5I:
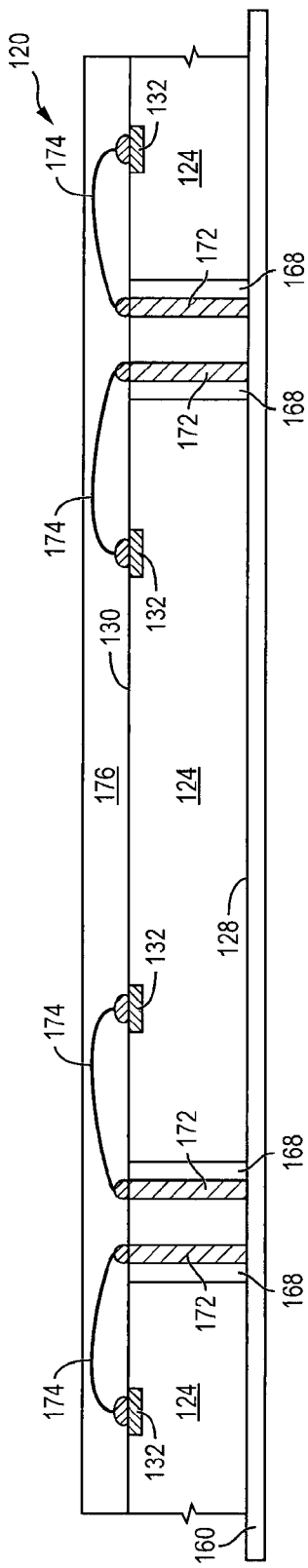

In FIG. 5i, an insulating or passivation layer 176 is formed over active surface 130 and bond wires 174 using PVD, CVD, printing, spin coating, spray coating, sintering or thermal oxidation. The insulating layer 176 contains one or more layers of SiO2, Si3N4, SiON, Ta2O5, Al2O3, or other material having similar insulating and structural properties. In one embodiment, insulating layer 176 is 50-100 μm in thickness to completely cover and protect bond wires 174.

Alternatively, an encapsulant or molding compound is deposited over semiconductor die 124 and bond wires 174 using a paste printing, compressive molding, transfer molding, liquid encapsulant molding, vacuum lamination, spin coating, or other suitable applicator. The encapsulant can be polymer composite material, such as epoxy resin with filler, epoxy acrylate with filler, or polymer with proper filler. The encapsulant is non-conductive and environmentally protects the semiconductor device from external elements and contaminants.

Figure 5J:
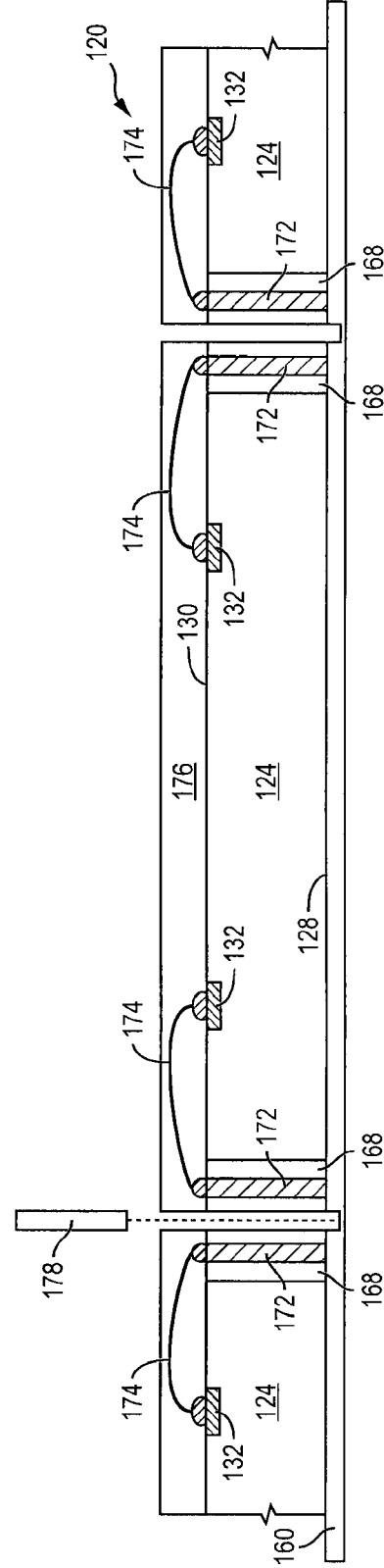

In FIG. 5j, a saw blade or laser cutting tool 178 cuts a center area of organic material 168 between the side-by-side conductive TOVs 172 to completely sever and singulate semiconductor die 124. Bisecting organic material 168 leaves full conductive TOVs 172 surrounded by organic material for each semiconductor die 124. The bond wires 174 and insulating layer 176 can be formed after wafer singulation.

Figure 6:
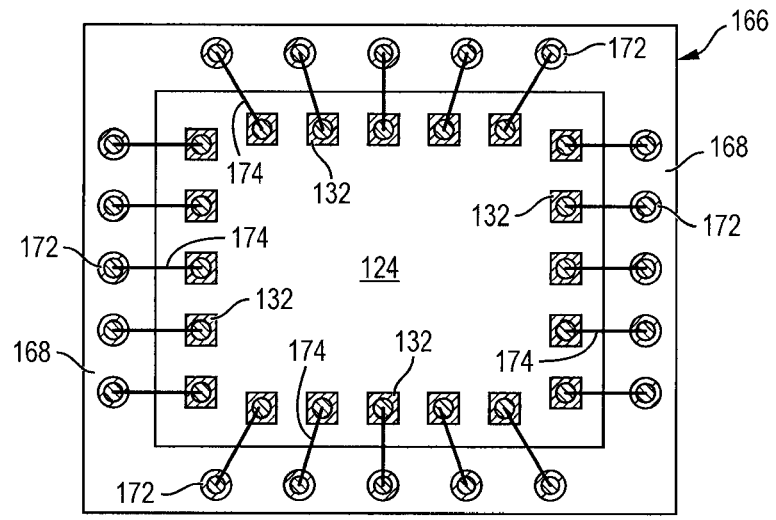
FIG. 6 illustrates the semiconductor die with bond wires formed between contact pads and full conductive TOVs.

FIG. 6 shows a top view of semiconductor die 124 with contact pads 132 and full conductive TOVs 172 formed in organic material 168 around peripheral area 166. Conductive TOVs 172 are surrounded by organic material 168. Bond wires 174 electrically connect contact pads 132 to full conductive TOVs 172. Contact pads 132 electrically connect to active and passive devices and signal traces in active surface 130 of semiconductor die 124. The full conductive TOVs 172 provide vertical z-direction electrical interconnect between opposite sides of semiconductor die 124. Bond wires 174 offer a low-cost and effective approach to electrical interconnect for semiconductor die 124.

Figure 7:
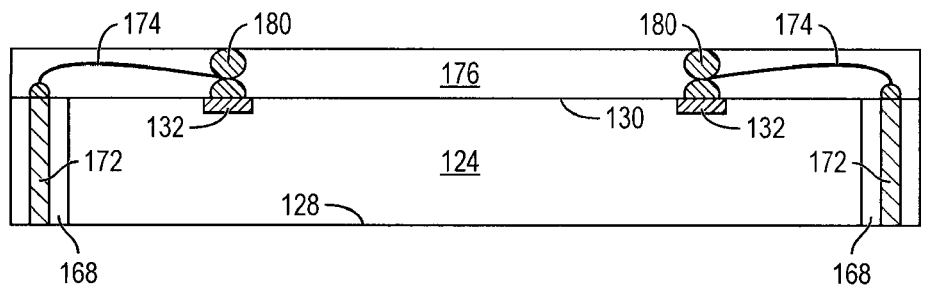
FIG. 7 illustrates the semiconductor die with stud bumps formed over the bond wires bumps on the contact pads.

FIG. 7 shows another embodiment, similar to FIGS. 5-6, with stud bumps 180 formed over the bond wire bumps on contact pads 132. Stud bumps 180 are exposed from insulating layer 176 for additional vertical electrical interconnect. The exposed stud bumps 180 enable device stacking without having to form openings in insulating layer 176. Bond wires 174 are electrically connected to stud bumps 180. The conductive TOVs can be full or half conductive TOVs, as described in FIGS. 3 and 5.

Figure 8:
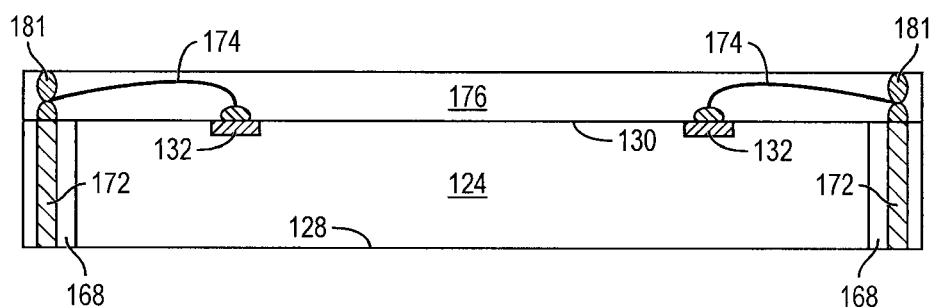
FIG. 8 illustrates the semiconductor die with stud bumps formed over the bond wires bumps on the conductive TOVs.

FIG. 8 shows another embodiment, similar to FIGS. 5-6, with stud bumps 181 formed over the bond wire bumps on conductive TOVs 172. Stud bumps 181 are exposed from insulating layer 176 for additional vertical electrical interconnect. The exposed stud bumps 181 enable device stacking without having to form openings in insulating layer 176. Bond wires 174 are electrically connected to stud bumps 181. The conductive TOVs can be full or half conductive TOVs, as described in FIGS. 3 and 5.

Figure 9:
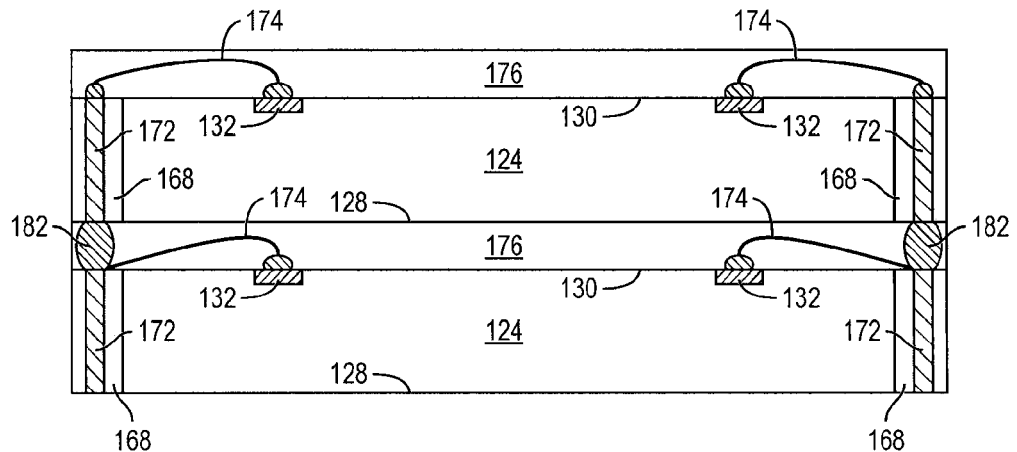
FIG. 9 illustrates stacked semiconductor die electrically interconnected with conductive TOVs and bond wires.

FIG. 9 shows another embodiment, similar to FIGS. 5-6, with stacked semiconductor die 124. Conductive TOVs 172 are exposed from insulating layer 176 prior to stacking semiconductor die 124. Conductive TOVs 172 between the stacked semiconductor die 124 are electrically connected with bumps 182. Alternatively, conductive TOVs 172 can be electrically connected with conductive paste, stud bumps, micro bumps, or other bonding agents. Accordingly, semiconductor die 124 are electrically connected through conductive TOVs 172, bumps 182, and bond wires 174. The conductive TOVs can be full or half conductive TOVs, as described in FIGS. 3 and 5.

Figure 10:
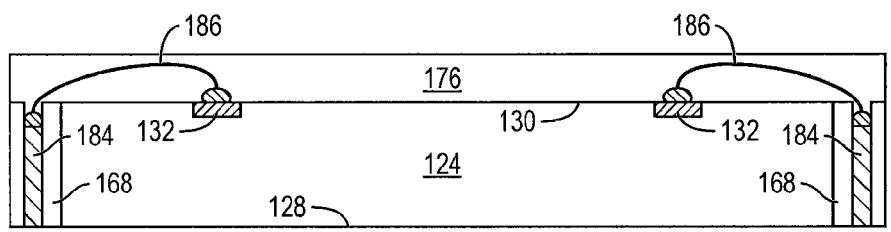
FIG. 10 illustrates the semiconductor die with recessed conductive TOVs.

FIG. 10 shows another embodiment, similar to FIGS. 5-6, with full conductive TOVs 184 recessed with respect to active surface 130. The recessed conductive TOVs 184 are formed by depositing less conductive material in vias 170, see FIG. 5i, so that the conductive material does not completely fill the vias. Bond wires 186 extend down to the top surface of recessed conductive TOVs 184 to electrically connect the conductive TOVs to contact pads 132. The recessed conductive TOVs 184 reduce loop height of bond wires 186 and package height of semiconductor die 124. In one embodiment, bond wires 186 have a maximum height of 25 μm above active surface 130. The conductive TOVs can be full or half conductive TOVs, as described in FIGS. 3 and 5.

Figure 11:
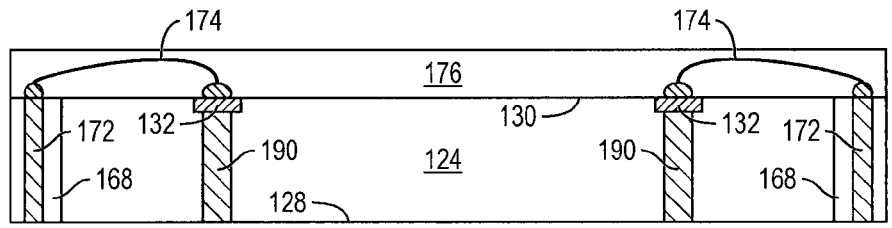
FIG. 11 illustrates the semiconductor die with conductive TSV formed under the contact pads.

FIG. 11 shows another embodiment, similar to FIGS. 5-6, with conductive through silicon vias (TSV) 190 formed through semiconductor die 124 under contact pads 132. A plurality of vias is formed through semiconductor die 124 under contact pads 132 by mechanical drilling, laser drilling, or DRIE. An electrically conductive material is deposited into the vias through a deposition process such as plating or plugging to form conductive TSVs 190. The conductive material can be Al, Cu, Sn, Ni, Au, Ag, W, or other suitable electrically conductive material. Conductive TSVs provide additional vertical z-direction electrical interconnect for semiconductor die 124.

Figure 12:
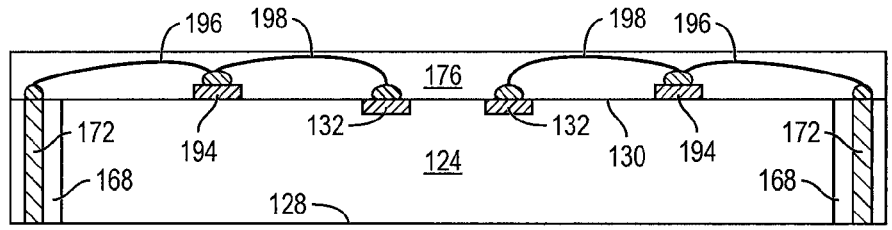
FIG. 12 illustrates the semiconductor die with bridging bond wires.

FIG. 12 shows another embodiment, similar to FIGS. 5-6, with bridging bond wires. Bridging bond pads 194 are formed on active surface 130 of semiconductor die 124. Bridging bond wires 196 are formed between contact pads 132 and bridging bond pads 194. Bridging bond wires 198 are formed between bridging bond pads 194 and full conductive TOVs 172. Bridging bond wires 196 and 198 are electrically connected to contact pads 132 and full conductive TOVs 172 with bond wire bumps. In one embodiment, bond wires 196 and 198 have a maximum height of 25 μm above active surface 130. The bridging bond wires 196-198 reduce movement of long wires during encapsulation. The conductive TOVs can be full or half conductive TOVs, as described in FIGS. 3 and 5.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor die;
   an insulating material formed in a peripheral region extending from an active surface of the semiconductor die to a back surface of the semiconductor die;
   a first conductive via formed through the insulating material in the peripheral region around the semiconductor die;
   a bond wire coupled between a contact pad on the semiconductor die and a portion of the first conductive via exposed from the insulating material; and
   an insulating layer formed over the bond wire and semiconductor die.

2. The semiconductor device of claim 1, further including a plurality of stacked semiconductor die electrically connected through the bond wires and first conductive vias.

3. The semiconductor device of claim 1, wherein the first conductive via is recessed with respect to a surface of the semiconductor die.

4. The semiconductor device of claim 1, further including a plurality of second conductive vias formed through the semiconductor die.

5. The semiconductor device of claim 2, further including:
   a first bond wire formed between the contact pad of the semiconductor die and a bridging bond pad on a surface of the semiconductor die; and
   a second bond wire formed between the bridging bond pad and the first conductive via.

6. The semiconductor device of claim 1, further including a stud bump formed over the bond wire.

7. A semiconductor device, comprising:
   a semiconductor wafer including a plurality of semiconductor die;
   an insulating material deposited between the semiconductor die;
   a plurality of first conductive vias formed in the insulating material;
   a plurality of bond wires coupled between contact pads on the semiconductor die and the first conductive vias; and
   an insulating layer formed over the bond wires and semiconductor die.

8. The semiconductor device of claim 7, further including a stud bump formed over the bond wires.

9. The semiconductor device of claim 7, wherein the first conductive vias are recessed with respect to a surface of the semiconductor die.

10. The semiconductor device of claim 7, further including a plurality of second conductive vias formed through the semiconductor die.

11. The semiconductor device of claim 7, wherein the bond wires include:
    a first bond wire formed between the contact pads of the semiconductor die and a bridging bond pad on a surface of the semiconductor die; and
    a second bond wire formed between the bridging bond pads and the first conductive vias.

12. A semiconductor device, comprising:
    a semiconductor die;
    an insulating material disposed in a peripheral region around the semiconductor die;
    a first conductive via formed through the insulating material; and
    a bond wire formed between a contact pad on the semiconductor die and the first conductive via.

13. The semiconductor device of claim 12, further including a plurality of stacked semiconductor die electrically connected through the bond wires and first conductive vias.

14. The semiconductor device of claim 12, wherein the first conductive via is recessed with respect to a surface of the semiconductor die.

15. The semiconductor device of claim 12, further including a plurality of second conductive vias formed through the semiconductor die.

16. The semiconductor device of claim 12, further including:
    a first bond wire formed between the contact pad of the semiconductor die and a bridging bond pad on a surface of the semiconductor die; and
    a second bond wire formed between the bridging bond pad and the first conductive via.

17. The device of claim 12, further including a stud bump formed over the bond wire.

* * * * *